(12) United States Patent
Chen et al.

(10) Patent No.: US 10,475,640 B2
(45) Date of Patent: Nov. 12, 2019

(54) METHOD FOR MANUFACTURING SEMICONDUCTOR DEVICE

(71) Applicant: UNITED MICROELECTRONICS CORPORATION, Hsinchu (TW)

(72) Inventors: Yan-Da Chen, Taipei (TW); Weng Yi Chen, Zhubei (TW); Chang-Sheng Hsu, Hsinchu (TW); Kuan-Yu Wang, New Taipei (TW); Yuan Sheng Lin, Taoyuan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 16/137,583

(22) Filed: Sep. 21, 2018

(65) Prior Publication Data

US 2019/0027358 A1    Jan. 24, 2019

Related U.S. Application Data

(62) Division of application No. 14/731,433, filed on Jun. 5, 2015, now Pat. No. 10,115,582.

(51) Int. Cl.
| | |
|---|---|
| *H01L 21/02* | (2006.01) |
| *B81C 1/00* | (2006.01) |
| *H01L 23/31* | (2006.01) |
| *H01L 21/768* | (2006.01) |

(52) U.S. Cl.
CPC .... *H01L 21/02107* (2013.01); *B81C 1/00801* (2013.01); *B81B 2207/015* (2013.01); *B81C 2201/014* (2013.01); *B81C 2201/016* (2013.01); *H01L 21/76829* (2013.01); *H01L 23/3171* (2013.01)

(58) Field of Classification Search
CPC .......... H01L 23/3171; H01L 21/76829; H01L 2924/0002; H01L 2924/00; B81C 1/00246
USPC ............... 257/415, 417, 419; 438/48, 50, 54
See application file for complete search history.

(56) References Cited

U.S. PATENT DOCUMENTS

| | | | |
|---|---|---|---|
| 4,622,576 A | | 11/1986 | Buynoski |
| 5,731,243 A | | 3/1998 | Peng |
| 8,310,065 B2 | | 11/2012 | Wu |
| 8,563,095 B2 | | 10/2013 | Rajagopalan |
| 2012/0175778 A1 | | 7/2012 | Wu |
| 2013/0026584 A1* | | 1/2013 | Adams et al. .......... H01L 29/87 257/415 |
| 2015/0035089 A1 | | 2/2015 | Liu |
| 2015/0175406 A1* | | 6/2015 | Lin et al. .................. B81B 7/00 257/415 |

* cited by examiner

*Primary Examiner* — Thinh T Nguyen
(74) *Attorney, Agent, or Firm* — Ding Yu Tan

(57) ABSTRACT

Provided herein is a method for manufacturing a semiconductor device. A substrate including a MEMS region and a connection region thereon is provided; a dielectric layer disposed on the substrate in the connection region is provided; a poly-silicon layer disposed on the dielectric layer is provided, wherein the poly-silicon layer serves as an etch-stop layer; a connection pad disposed on the poly-silicon layer is provided; and a passivation layer covering the dielectric layer is provided, wherein the passivation layer includes an opening that exposes the connection pad and a transition region between the connection pad and the passivation layer, and a conductive layer conformally covering the connection pad and the poly-silicon layer in the transition region is provided.

4 Claims, 3 Drawing Sheets

METHOD FOR MANUFACTURING SEMICONDUCTOR DEVICE

CROSS-REFERENCE TO RELATED APPLICATIONS

This application is a divisional application of an U.S. application Ser. No. 14/731,433, filed on Jun. 5, 2015, the entire contents of which are incorporated herein by reference.

FIELD OF THE INVENTION

The present invention generally relates to a semiconductor device and a method for manufacturing the same and, more particularly, to a method for manufacturing the semiconductor device.

BACKGROUND OF THE INVENTION

In micro-electro-mechanical system (MEMS) technology, a MEMS device is integrated with a logic circuit including, for example, a complementary metal-oxide-semiconductor (CMOS) device in a single chip by using conventional semiconductor manufacturing processes such as electroplating and etching.

The dimension of the features of the logic circuit is becoming smaller to allow greater aerial densities across the substrate. The features may include connector bumps, interconnects, semiconducting or oxide features, gates, electrodes, resistors, vias and many others. The features are covered by a passivation layer to protect thereof or to electrically isolate the features. However, the formation of the passivation layer may cause a particular problem.

For example, a conventional passivation layer 10 can be used to cover features 12, as shown in FIG. 1, to protect the features 12 that may be used as interconnects or connector bumps to connect the active and passive devices on a substrate 14. However, it becomes increasingly difficult to deposit a continuous, conformal, and substantially defect-free passivation layer 10 around the features 12. Referring to FIG. 1, the passivation layer 10 forms a plurality of seams 16, which split open the passivation layer 10 at a plurality of bottom side-wall corners 18 of the features 12. These seams 16 induce cracking during the subsequent wet etching process.

U.S. Pat. No. 8,563,095 disclose an approach to solving the problems related to the seams of the passivation layer. In U.S. Pat. No. 8,563,095, prior to depositing a dielectric layer, a plurality of steps including plasma cleaning, conformal liner deposition and adhesion layer deposition are performed.

Accordingly, it is needed to provide an improved passivation layer on a feature in order to solve the above-mentioned problems relating to cracking induced by the seams at the bottom side-wall corner thereof during wet etching process, so as to achieve a seam-free passivation layer.

SUMMARY OF THE INVENTION

It is one object of the present invention to provide a semiconductor device with a seam-free passivation layer on a feature and a method for manufacturing the semiconductor device.

It is another object of the present invention to provide a MEMS device integrated with a logic circuit in a single chip with a seam-free passivation layer on a connection region of the logic circuit.

In order to achieve the foregoing objects, in one embodiment, the present invention provides a semiconductor device including a substrate including a MEMS region and a connection region thereon; a dielectric layer disposed on the substrate in the connection region; a poly-silicon layer disposed on the dielectric layer, wherein the poly-silicon layer serves as an etch-stop layer; a connection pad disposed on the poly-silicon layer; and a passivation layer covering the dielectric layer, wherein the passivation layer includes an opening that exposes the connection pad and a transition region between the connection pad and the passivation layer.

In order to achieve the foregoing objects, in one embodiment, the present invention further provides a method for manufacturing a semiconductor device. The method includes the following steps. A substrate including a MEMS region and a connection region thereon is provided. A dielectric layer is disposed on the substrate in the connection region. A poly-silicon layer is disposed on the dielectric layer. The poly-silicon layer serves as an etch-stop layer. A connection pad is disposed on the poly-silicon layer. A passivation layer is provided to cover the dielectric layer. The passivation layer includes an opening that exposes the connection pad and a transition region between the connection pad and the passivation layer.

In order to achieve the foregoing objects, in one embodiment, the present invention further provides a method to remove a portion of the passivation layer at the bottom side-wall corners of the feature using an etch-stop layer underneath the portion of the passivation layer to achieve a seam-free passivation layer.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of the embodiments of this invention are presented herein for purpose of illustration and description only. It is not intended to be exhaustive or to be limited to the precise form disclosed.

Figure 1:
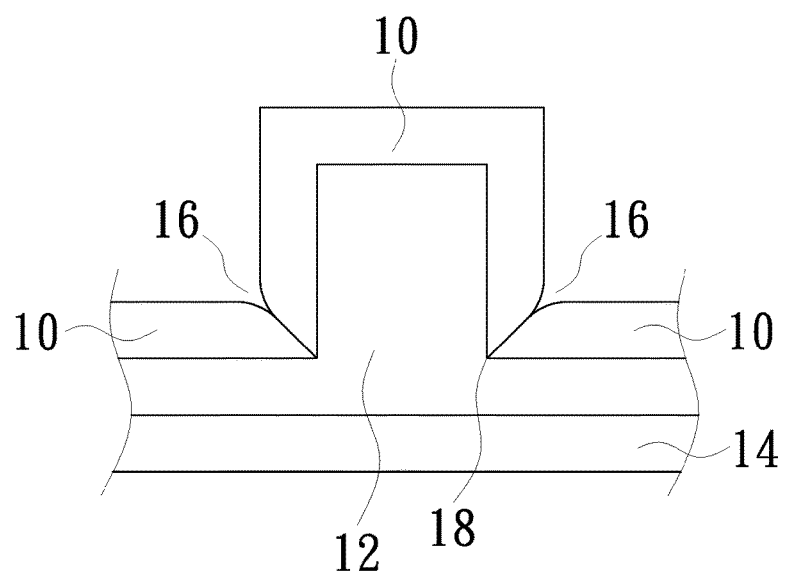
FIG. 1 (Prior Art) is a schematic cross-sectional view of a substrate showing the seams at the bottom side-wall corners of a passivation layer covering a feature that is an interconnect.
Figure 2:
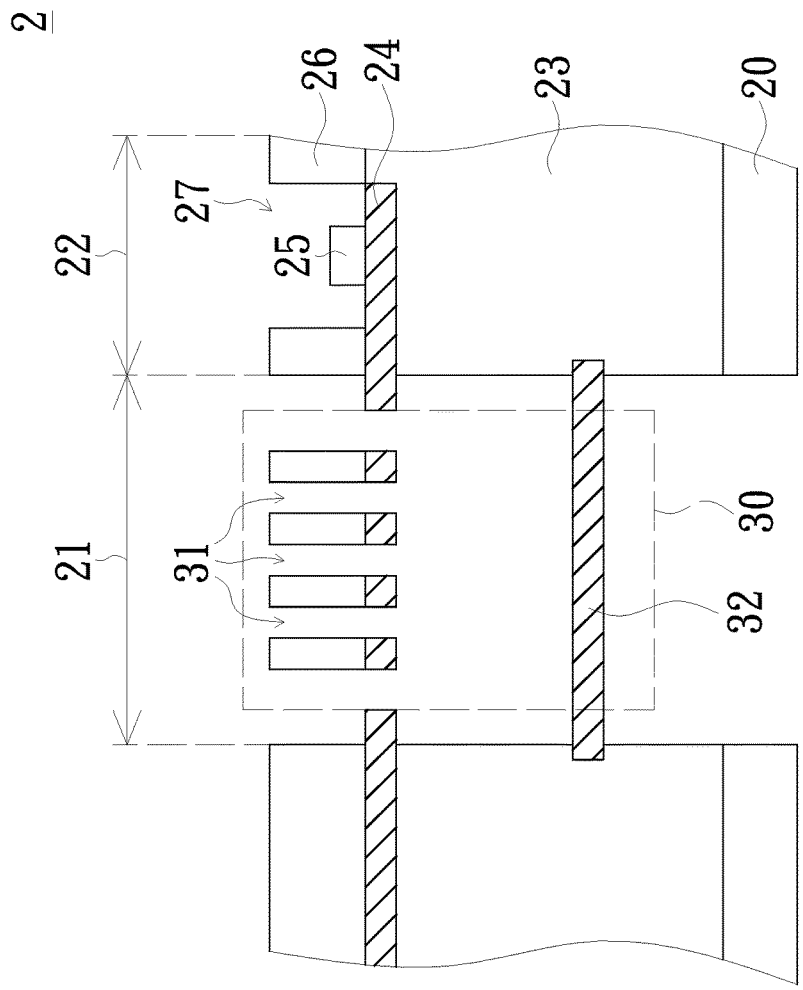
FIG. 2 is a schematic cross-sectional view of a semiconductor device according to one embodiment of the present invention.
Figure 3A:
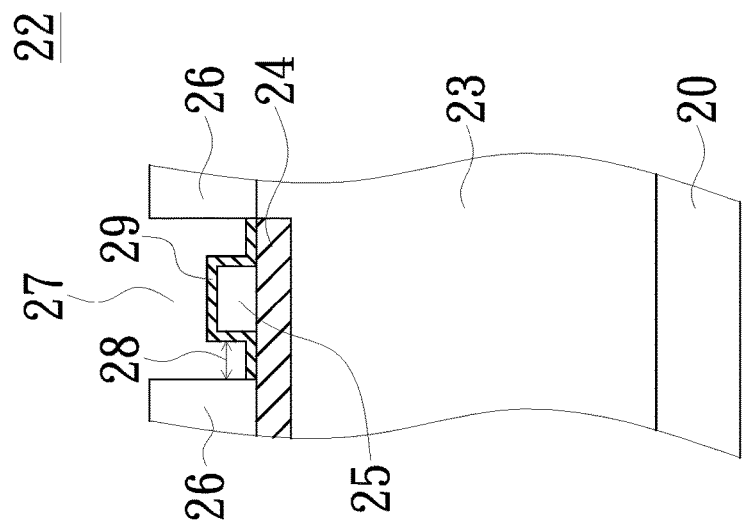
FIG. 3A is an enlarged view of a connection portion of a semiconductor device according to one embodiment of the present invention.
Figure 3B:
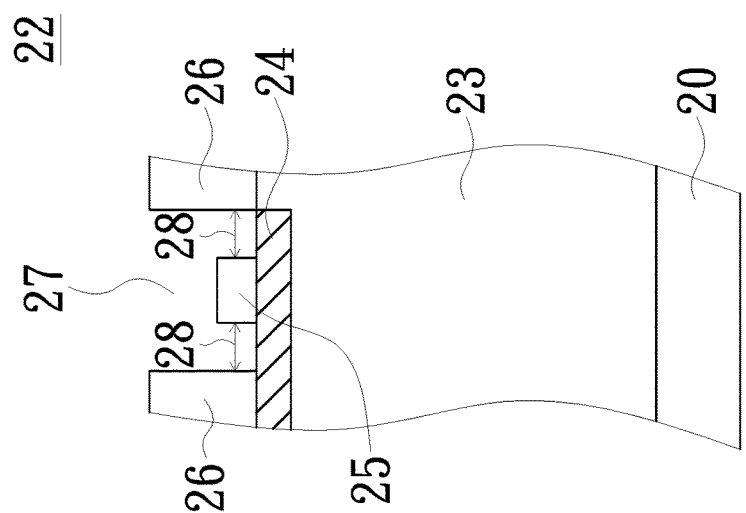
FIG. 3B is an enlarged view of a connection portion of a semiconductor device according to another embodiment of the present invention.

Please refer to FIG. 2, FIGS. 3A and 3B. FIG. 2 is a schematic cross-sectional view of a semiconductor device according to one embodiment of the present invention.

FIGS. 3A and 3B are enlarged views of a connection portion of a semiconductor device according to the present invention.

In FIG. 2, the semiconductor device 2 includes a substrate 20, a dielectric layer 23, a poly-silicon layer 24, a connection pad 25 and a passivation layer 26. More particularly, the substrate 20 includes a MEMS region 21 and a connection region 22 thereon.

In the connection region 22, the dielectric layer 23 is disposed on the substrate 20. The poly-silicon layer 24 is disposed on the dielectric layer 23. The connection pad 25 is disposed on the poly-silicon layer 24. The poly-silicon layer 24 serves as an etch-stop layer to prevent wet etchants from contacting the dielectric layer 23 underneath the connection region 22. The passivation layer 26 covers the dielectric layer 23 and the poly-silicon layer 24. Moreover, with reference to FIG. 2, FIGS. 3A and 3B, the passivation layer 26 includes an opening 27 that exposes the connection pad 25 and a transition region 28 between the connection pad 25 and the passivation layer 26. In one embodiment, the substrate 20 may be, for example, a silicon substrate or a substrate with previously formed logic transistors thereon. The present invention is, however, not limited to the previous examples of the substrate 20. The person with ordinary skill in art may make any modification on the substrate 20 within the scope of the present invention.

It should be noted that the poly-silicon layer 24 serves as an etch-stop layer that is resistant to the etchant that removes the passivation layer 26 covering the connection pad 25. In one embodiment, the etch-stop layer may be strengthened by further depositing a conductive layer 29 covering the connection pad 25 and the poly-silicon layer 24 in the transition region 28, as shown in FIG. 3B.

In one embodiment, the conductive layer 29 may include a single layer including metal, conductive oxide, conductive nitride or combination thereof. In other embodiments, the conductive layer 29 may include multiple layers including metal, conductive oxide, conductive nitride or combination thereof. The present invention is, however, not limited to the previous examples of the conductive layer 29. The person with ordinary skill in art may make any modification on the conductive layer 29 within the scope of the present invention.

In the MEMS region 21, with reference to FIG. 2, the semiconductor device 2 includes at least one MEMS device 30. The MEMS device 30 includes, for example, a plurality of holes 31 and at least one MEMS diaphragm 32 carried by the substrate 20. In the present embodiment, the MEMS device 30 may be used as a MEMS microphone. The present invention is, however, not limited to the previous examples of the MEMS device 30. The person with ordinary skill in art may make any modification on the MEMS device 30 within the scope of the present invention.

In the present invention, the MEMS device 30 in the MEMS region 21 provides mechanical characteristics and the connection pad 25 in the connection region 22 electrically connects the MEMS device 30 to the outside circuitry (not shown). More particularly, the connection pad 25 receives the signals transferred from the MEMS device 30 that are processed by a logic circuit (not shown). The logic circuit may include a metal-oxide-semiconductor (MOS) transistor, a memory device, a bipolar junction transistor, a high voltage device or a combination thereof.

The main feature of the present invention is that a portion of the passivation layer 26 at the bottom side-wall corner of the connection pad 25 is removed using the poly-silicon layer 24 as an etch-stop layer underneath the portion of the passivation layer 26 at the bottom side-wall corner of the connection pad 25 to achieve a seam-free (or without seam or seamless) passivation layer 26. As a result, the problems due to cracking induced by the seams at the bottom side-wall corner during wet etching process found in conventional passivation layer can be solved.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a semiconductor device, comprising:
   providing a substrate comprising a MEMS region and a connection region thereon;
   providing a dielectric layer disposed on said substrate in said connection region;
   providing a poly-silicon layer disposed on said dielectric layer, wherein said poly-silicon layer serves as an etch-stop layer to prevent wet etchants from contacting said dielectric layer underneath said connection region;
   providing a connection pad disposed on said poly-silicon layer;
   providing a passivation layer covering said dielectric layer, wherein the passivation layer comprises an opening that exposes said connection pad and a transition region between said connection pad and said passivation layer; and
   providing a conductive layer conformally covering said connection pad and said poly-silicon layer in said transition region.

2. The method of claim 1, wherein said conductive layer comprises a single layer comprising metal, conductive oxide, conductive nitride or combination thereof.

3. The method of claim 1, wherein said conductive layer comprises multiple layers comprising metal, conductive oxide, conductive nitride or combination thereof.

4. The method of claim 1, wherein said MEMS region comprises a plurality of sealed micromachined mesh membranes carried by said substrate.

* * * * *